(12) United States Patent
Takeoka (10) Patent No.: US 7,781,844 B2
(45) Date of Patent: Aug. 24, 2010

(54) SEMICONDUCTOR DEVICE HAVING A STRESSOR FILM

(75) Inventor: Shinji Takeoka, Toyama (JP)

(73) Assignee: Panasonic Corporation, Osaka (JP)

( * ) Notice: Subject to any disclaimer, the term of this patent is extended or adjusted under 35 U.S.C. 154(b) by 155 days.

(21) Appl. No.: 11/907,319

(22) Filed: Oct. 11, 2007

(65) Prior Publication Data
US 2008/0128823 A1    Jun. 5, 2008

(30) Foreign Application Priority Data
Nov. 30, 2006    (JP) ............................. 2006-323674

(51) Int. Cl.
*H01L 23/62* (2006.01)
(52) U.S. Cl. ...................... 257/369; 257/411
(58) Field of Classification Search .......... 257/E21.626, 257/411
See application file for complete search history.

(56) References Cited

U.S. PATENT DOCUMENTS

| | | | | |
|---|---|---|---|---|
| 6,730,556 | B2 * | 5/2004 | Wu et al. ..................... | 438/230 |
| 7,462,915 | B2 * | 12/2008 | Yang et al. ................... | 257/369 |
| 7,514,331 | B2 * | 4/2009 | Yoon et al. .................. | 438/303 |
| 7,521,307 | B2 * | 4/2009 | Zhu et al. ..................... | 438/199 |
| 2007/0252214 | A1 * | 11/2007 | Zhu et al. ..................... | 257/369 |

FOREIGN PATENT DOCUMENTS

JP    2003-060076    2/2003

OTHER PUBLICATIONS

Mistry, K. et al. "Delaying Forever; Uniaxial Strained Silicon Transistors in a 90nm CMOS Technology", Symposium on VLSI Technology, Digest of Technical Papers, pp. 50-51, 2004.

* cited by examiner

*Primary Examiner*—Thanh V Pham
*Assistant Examiner*—Caleb Henry
(74) *Attorney, Agent, or Firm*—McDermott Will & Emery LLP (57) ABSTRACT

A first NMIS transistor includes: a first gate dielectric film over the first active region; a first gate electrode on the first gate dielectric film; a first side-wall dielectric film on side surfaces of the first gate dielectric film and the first gate electrode; a first source/drain region in the first active region outside the first side-wall dielectric film; a first silicide layer in a top-layer portion of the first source/drain region; a second side-wall dielectric film on the first silicide layer around a corner at which the side surface of the first side-wall dielectric film meets an upper surface of the first silicide layer; and a first stressor film for exerting a tensile stress on a channel region in a gate length direction, the first stressor film covering the first gate electrode, the first side-wall dielectric film, and the second side-wall dielectric film.

13 Claims, 10 Drawing Sheets

SEMICONDUCTOR DEVICE HAVING A STRESSOR FILM

CLAIM OF PRIORITY

This application claims the benefit of Japanese Patent Application No. JP 2006-323674, filed on Nov. 30, 2006, the disclosure of which is incorporated herein by reference.

BACKGROUND OF THE INVENTION

1. Field of the Invention

The present invention relates to a semiconductor device and a method for fabricating the same. Specifically, the present invention relates to a field effect transistor having a configuration capable of suppressing formation of a slit in a stressor film to improve drivability of the transistor and to a method for fabricating the same.

2. Description of the Prior Art

As the design rule of semiconductor devices shrinks, the integration degree of circuits is rapidly improved. It is even possible to mount more than or equal to a hundred million transistors on a chip. In order to realize such a chip, progress in ultra-fine patterning technology such as lithography or etching requiring a processing accuracy of the order of several tens of nano meters is required. In addition to the progress, an increase in drivability of the transistor is highly required for ensuring an absolute magnitude of a current also in a case of forming a fine transistor.

As one of techniques to improve the drivability of the transistor, exerting stress to a channel section has been a subject of interest in recent years. This is a method for exerting stress on silicon serving as a substrate to change a band structure thereof for improving the carrier mobility. A conventional research has been proved that it is effective to exert a tensile stress on a channel section in the gate length direction to improve the mobility in an n-channel MIS (Metal Insulator Semiconductor) transistor (NMIS). Meanwhile, as to a p-channel MIS transistor (PMIS), it is effective to exert s compressive stress on the channel section in the gate length direction.

As a method for exerting stress on a channel section, using a stressor film has been proposed (for example, see Japanese Laid-Open Patent Publication No. 2003-60076).

Figure 10A:
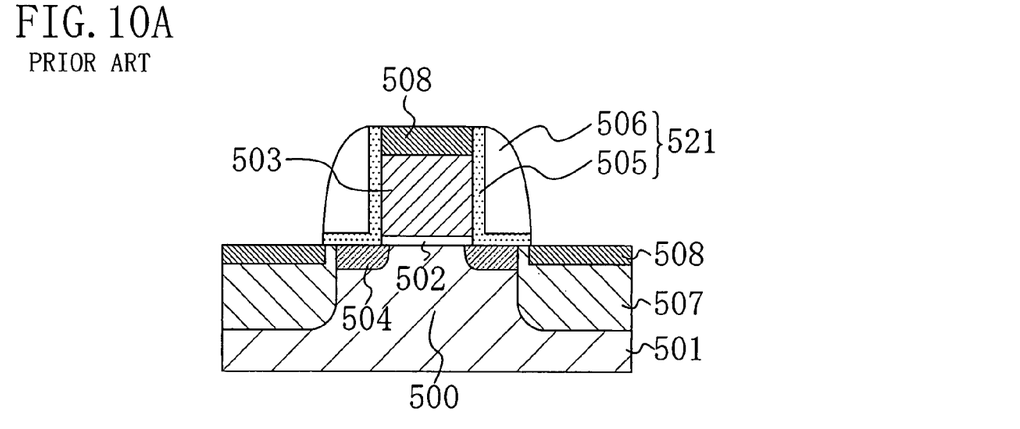
FIGS. 10A through 10C are cross sectional views showing a main part of a conventional semiconductor device, with reference to which a method for fabricating the conventional semiconductor device is described in the order of steps.
Figure 10B:
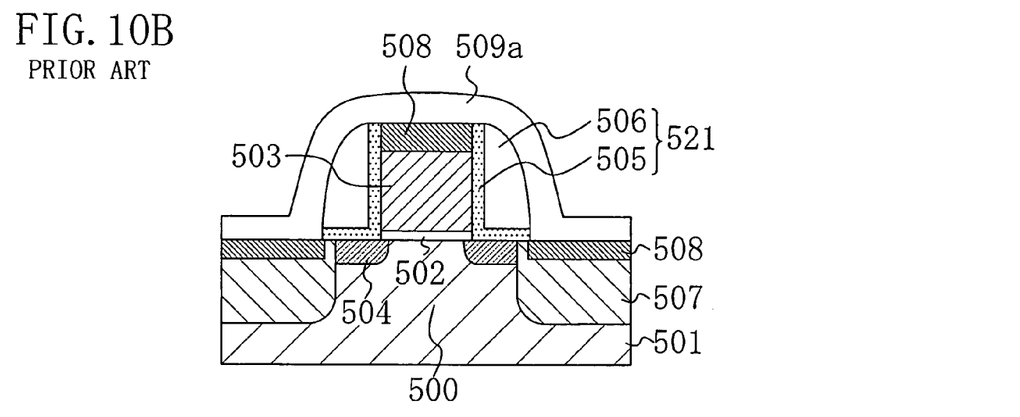
Figure 10C:
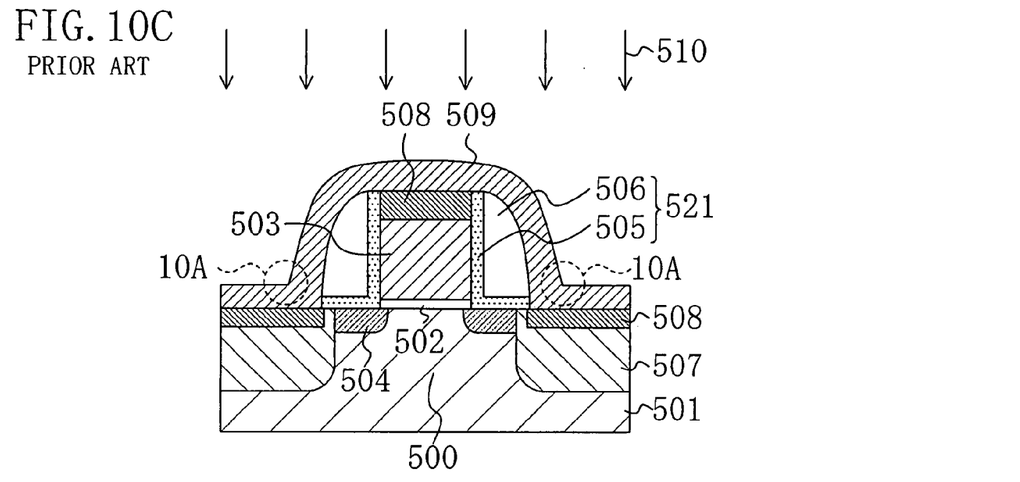

FIGS. 10A through 10C are cross sectional views showing a main part of a conventional semiconductor device, with reference to which a method for fabricating the conventional semiconductor device is described in the order of steps.

First, as illustrated with FIG. 10A, an active region 500 is formed in a semiconductor substrate 501. Then, over the active region 500, a gate electrode 503 is formed through a gate dielectric film 502. Subsequently, in regions in the active region 500 at both sides of the gate electrode 503, n-type source/drain regions 504 having a shallow junction depth are formed.

Next, on side surfaces of the gate electrode 503 and the gate dielectric film 502 and over the active region 500, dielectric films 505 having L-shaped cross sections are formed. Then, on inner surfaces of the L-shaped dielectric films 505, side-walls 506 are formed. Each L-shaped dielectric film 505 and its corresponding side-wall 506 constitute a side-wall spacer 521. Subsequently, n-type source/drain regions 507 having a deep junction depth are formed in regions in the active region 500 outside the side-wall spacers 521. Then, on the gate electrode 503 and on the n-type source/drain regions 507, silicide layers 508 are formed.

Next, as illustrated with FIG. 10B, over the semiconductor substrate 501, a stressor film 509a of a silicon nitride film is formed to cover the gate electrode 503 and the side-wall spacers 521. The stressor film 509a immediately after the formation has a very small film stress. Therefore, in the step, almost no tensile stress is exerted on a channel region in the gate length direction.

Next, as illustrated with FIG. 10C, ultraviolet irradiation 510 is performed for causing contraction of the stressor film 509a to form a stressor film 509 for exerting a great tensile stress on the channel region in the gate length direction. Then, on the stressor film 509, an interlayer dielectric film is formed, although the interlayer dielectric film is not shown.

By forming a stressor film having a great film stress through the steps above, a tensile stress is exerted on the channel region of an NMIS transistor in the gate length direction, which improves the drivability of the NMIS transistor.

Moreover, it is disclosed in the document of K. Mistry et al., Symp. on VLSI Tech., Digest of Tech. Papers, pp. 50-51 (2004) that drivability of an NMIS transistor depends on the film thickness of a stressor film, and that increasing the film thickness of the stressor film formed of a nitride film to 80 nm improves the drivability of the NMIS transistor by 12%. That is, it can be said that drivability of the NMIS transistor can be effectively increased by forming a stressor film of a material having a great tensile stress and by increasing the thickness of the stressor film as much as possible.

However, it turned out that slits are formed in regions 10A of FIG. 10C in the stressor film 509 formed according to the above-mentioned, conventional method for fabricating a semiconductor device. The reason for this is assumed that in the step of performing the ultraviolet irradiation 510 for causing contraction of the stressor film of FIG. 10C, the contraction of the stressor film 509 occurs on the side-wall spacers 521 and on the silicide layers 508, and the contraction force becomes greater near interfaces between the side-wall spacers 521 and the silicide layers 508 over the semiconductor substrate 501, resulting in formation of the slits in the regions 10A. As in this case, if slits are formed in the stressor film 509, a problem arises that the drivability of the NMIS transistor does not increase even if the thickness of the stressor film is increased in an attempt to increase the tensile stress exerted on the channel region in the gate length direction.

SUMMARY OF THE INVENTION

In view of the problems, an object of the present invention is to provide a semiconductor device having a configuration capable of preventing formation of a slit in a stressor film and a method for fabricating the same. With this configuration and this method, a tensile stress exerted on a channel region in the gate length direction can be increased by increasing the film thickness of the stressor film, which allows realization of an NMIS transistor having high drivability.

To achieve the object, a semiconductor device of one aspect of the present invention includes an NMIS transistor over a first active region of a semiconductor substrate, the NMIS transistor including: a first gate dielectric film over the first active region; a first gate electrode on the first gate dielectric film; a first side-wall dielectric film on side surfaces of the first gate dielectric film and the first gate electrode; a first source/drain region in the first active region outside the first side-wall dielectric film; a first silicide layer in a top-layer portion of the first source/drain region; a second side-wall dielectric film on the first silicide layer around a corner at which the side surface of the first side-wall dielectric film meets an upper surface of the first silicide layer; and a first stressor film for exerting a tensile stress on a channel region in a gate length direction, the first stressor film covering the first gate electrode, the first side-wall dielectric film, and the second side-wall dielectric film.

According to the semiconductor device of the one aspect of the present invention, the second side-wall dielectric film is provided around the corner at which the side surface of the first side-wall dielectric film meets the upper surface of the first silicide layer. Therefore, around the corner, side surface of the second side-wall dielectric film on which the first stressor film is to be formed has a smooth shape. In this configuration, since the first stressor film is not formed over a steep region (region on which stress concentrates) of the side surface of the first side-wall dielectric film, no slit is formed in the first stressor film. Therefore, also in a case where the thickness of the first stressor film having a great film stress is increased, it is possible to suppress formation of a slit in the first stressor film, and this makes it possible to prevent saturation of drivability of the NMIS transistor conventionally caused by formation of a slit in the stressor film. That is, increasing the film thickness of the first stressor film having a great film stress makes it possible to improve the drivability of the NMIS transistor.

In the semiconductor device of the one aspect of the present invention, the second side-wall dielectric film is lower in height than the first side-wall dielectric film.

In the semiconductor device of the one aspect of the present invention, a material of at least the side surface of the first side-wall dielectric film is preferably different from a material of the second side-wall dielectric film.

With this configuration, it is possible to suppress reduction of film in the first side-wall dielectric film during the formation of the second side-wall dielectric film. Thus, it is possible to prevent defects, typically an increase in contact leak current, which may occur along with a change in shape of the first side-wall dielectric film.

In the semiconductor device of the one aspect of the present invention, the first side-wall dielectric film is preferably composed of: a first dielectric film being in contact with the side surface of the first gate electrode and having an L-shaped cross section; and a first side-wall on an inner surface of the first dielectric film.

As described above, the present invention is more effective in such a configuration that the side surface of the first side-wall dielectric film including the first dielectric film having the L-shaped cross section has a steep bottom section, and thus a slit is easily formed primarily.

In the semiconductor device of the one aspect of the present invention, the first stressor film is preferably formed of a silicon nitride film or a silicon nitride film containing hydrogen.

In the semiconductor device of the one aspect of the present invention, the first stressor film has no slit formed around the corner at which the side surface of the first side-wall dielectric film meets the upper surface of the first silicide layer.

In the semiconductor device of the one aspect of the present invention, the semiconductor device further includes a PMIS transistor over a second active region in the semiconductor substrate, the second active region being different from the first active region, the PMIS transistor including: a second gate dielectric film over the second active region; a second gate electrode on the second gate dielectric film; a third side-wall dielectric film on side surfaces of the second gate dielectric film and the second gate electrode; a second source/drain region in the second active region outside the third side-wall dielectric film; a second silicide layer in a top-layer portion of the second source/drain region; a second stressor film for exerting a compressive stress on a channel region in a gate length direction, the second stressor film covering the second gate electrode and the third side-wall dielectric film.

In this configuration, the second active region is provided with no side-wall dielectric film corresponding to the second side-wall dielectric film over the first active region. Therefore, it is possible to reduce the distance between gate electrodes in an integrated circuit. This can contribute to improvement in integration degree. Moreover, in the PMIS transistor, the second stressor film has the compressive stress. Therefore, even if the thickness of the second stressor film is increased, there is no concern that slits may be formed.

In the semiconductor device of the one aspect of the present invention, the second side-wall dielectric film and the second stressor film are formed of the same dielectric film.

In the semiconductor device of the one aspect of the present invention, no side-wall dielectric film is provided around a corner at which a side surface of the third side-wall dielectric film meets an upper surface of the second silicide layer.

A method for fabricating a semiconductor device of one aspect of the present invention includes the steps of: (a) forming a first gate dielectric film over a first active region in a semiconductor substrate; (b) forming a first gate electrode on the first gate dielectric film; (c) forming a first side-wall dielectric film on side surfaces of the first gate dielectric film and the first gate electrode; (d) forming a first source/drain region in the first active region outside the first side-wall dielectric film; (e) forming a first silicide layer in a top-layer portion of the first source/drain region; (f) over the first active region, forming a deposition film for a second side-wall dielectric film to cover the first silicide layer, the first gate electrode, and the first side-wall dielectric film; (g) etching the deposition film for the second side-wall dielectric film to form the second side-wall dielectric film on the first silicide layer around a corner at which a side surface of the first side-wall dielectric film meets an upper surface of the first silicide layer; and (h) over the first active region, forming a first stressor film for exerting a tensile stress on a channel region in a gate length direction to cover the first silicide layer, the first gate electrode, the first side-wall dielectric film, and the second side-wall dielectric film.

According to the method for fabricating a semiconductor device of the one aspect of the present invention, the second side-wall dielectric film is formed around the corner at which the side surface of the first side-wall dielectric film meets the upper surface of the first silicide layer. Therefore, around the corner, side surface of the second side-wall dielectric film on which the first stressor film is to be formed has a smooth shape. In this configuration, since the first stressor film is not formed over a steep region (region on which stress concentrates) of the side surface of the first side-wall dielectric film, no slit is formed in the first stressor film. Therefore, also in a case where the thickness of the first stressor film having a great film stress is increased, it is possible to suppress formation of a slit in the first stressor film, and this makes it possible to prevent saturation of drivability of the NMIS transistor conventionally caused by formation of a slit in the stressor film. That is, increasing the film thickness of the first stressor film having a great film stress makes it possible to improve the drivability of the NMIS transistor. Moreover, since the second side-wall dielectric film is formed after the formation of the first silicide layer, the shape of the first silicide layer is not changed, so that deterioration in properties attributed to silicide, typically an increase in junction leak current, does not occur.

According to the method for fabricating a semiconductor device of the one aspect of the present invention, a material of at least the side surface of the first side-wall dielectric film is preferably different from a material of the deposition film for the second side-wall dielectric film.

With this method, it is possible to suppress reduction of film in the first side-wall dielectric film during the formation of the second side-wall dielectric film. Thus, it is possible to prevent defects, typically an increase in contact leak current, which may occur along with a change in shape of the first side-wall dielectric film.

According to the method for fabricating a semiconductor device of the one aspect of the present invention, to form the first side-wall dielectric film, step (c) preferably includes: forming a first dielectric film being in contact with a side surface of the first gate electrode and having an L-shaped cross section; and forming a first side-wall on an inner surface of the first dielectric film.

As described above, the present invention is more effective in such a configuration that the side surface of the first side-wall dielectric film including the first dielectric film having the L-shaped cross section has a steep bottom section, and thus a slit is easily formed primarily.

According to the method for fabricating a semiconductor device of the one aspect of the present invention, to form the first stressor film, step (h) includes: over the first active region, forming a silicon nitride film or a silicon nitride film containing hydrogen by plasma CVD to cover the first silicide layer, the first gate electrode, the first side-wall dielectric film, and the second side-wall dielectric film; and then performing ultraviolet irradiation.

According to the method for fabricating a semiconductor device of the one aspect of the present invention, to form the first stressor film, step (h) includes: over the first active region, forming a silicon nitride film or a silicon nitride film containing hydrogen by plasma CVD to cover the first silicide layer, the first gate electrode, the first side-wall dielectric film, and the second side-wall dielectric film; and then performing thermal annealing.

According to the method for fabricating a semiconductor device of the one aspect of the present invention, step (a) includes forming a second gate dielectric film over a second active region in the semiconductor substrate, the second active region being different from the first active region, step (b) includes forming a second gate electrode on the second gate dielectric film, step (c) includes forming a third side-wall dielectric film on side surfaces of the second gate dielectric film and the second gate electrode, step (d) includes forming a second source/drain region in the second active region outside the third side-wall dielectric film, step (e) includes forming a second silicide layer in a top-layer portion of the second source/drain region, step (f) includes forming the deposition film for the second side-wall dielectric film over the second active region to cover the second silicide layer, the second gate electrode, and the third side-wall dielectric film, and step (g) includes etching the deposition film for the second side-wall dielectric film by using a resist pattern masking the second active region to form a second stressor film for exerting a compressive stress on a channel region in the gate length direction to cover the second silicide layer, the second gate electrode, and the third side-wall dielectric film.

In this configuration, no side-wall dielectric film corresponding to the second side-wall dielectric film over the first active region is formed over the second active region. Therefore, it is possible to reduce the distance between gate electrodes in an integrated circuit. This can contribute to improvement in integration degree. Moreover, the second stressor film over the second active region has the compressive stress.

Therefore, even if the thickness of the second stressor film is increased, there is no concern that slits may be formed.

As described above, according to the present invention, it is possible to realize a semiconductor device having a configuration capable of preventing formation of a slit in a stressor film and a method for fabricating the same. This makes it possible to increase the film thickness of the stressor film to increase the tensile stress exerted on a channel region in the gate length direction, so that an NMIS transistor having high drivability can be realized.

DESCRIPTION OF THE PREFERRED EMBODIMENTS

A configuration of a semiconductor device of Embodiment 1 of the present invention will be described below with reference to the drawings.

Figure 1:
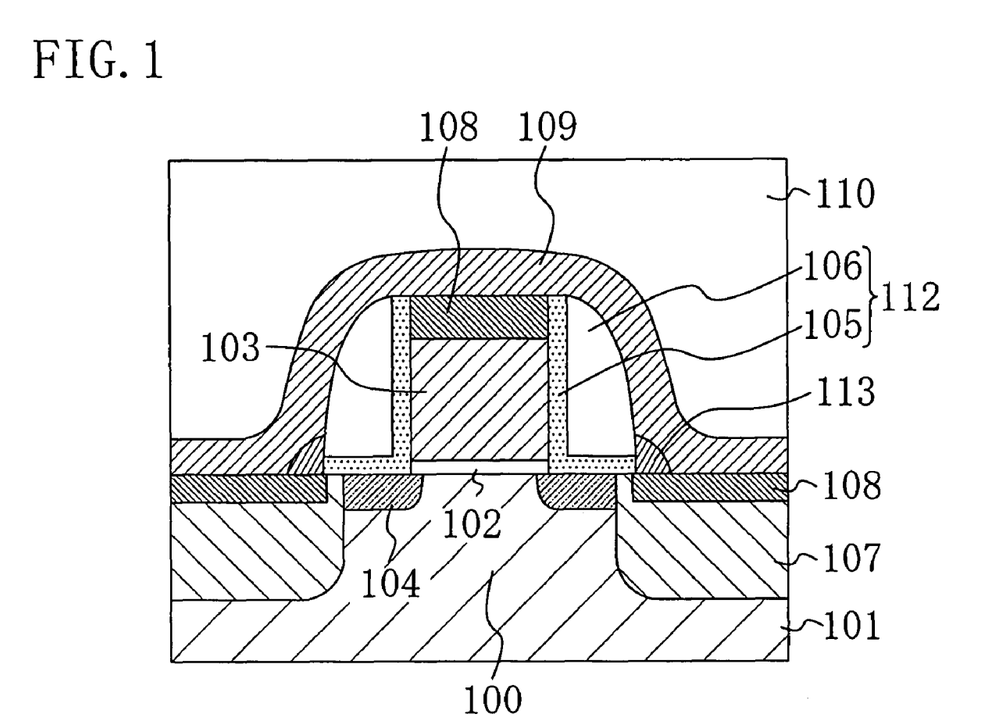
FIG. 1 is a cross sectional view showing a configuration of a main part of a semiconductor device of Embodiment 1 of the present invention.

FIG. 1 is a cross sectional view showing a configuration of a main part of a semiconductor device of Embodiment 1 of the present invention.

As shown in FIG. 1, a semiconductor substrate 101 formed of silicon or the like has an active region 100 surrounded by a device isolation region which is not shown. The active region 100 is provided with a p-well (not shown). Over the active region 100, a gate electrode 103 having a silicide layer 108 in its top-layer portion is formed through a gate dielectric film 102. The gate dielectric film 102 is formed of a SiON-based film or the like and has a film thickness of about 2 nm. The gate electrode 103 has a thickness of about 110 nm. The silicide layer 108 is formed of NiSi or the like and has a layer thickness of about 20 nm. The gate electrode 103 has a gate length of about 50 nm. In regions in the active region 100 at both sides of the gate electrode 103, an n-type impurity such as arsenic or phosphorus is implanted to form n-type shallow source/drain regions (n-type extension regions or n-type LDD regions) 104 having a shallow junction depth.

On side surfaces of the silicide layer 108, the gate electrode 103, and the gate dielectric film 102 and over the active region 100, dielectric films 105 formed of $SiO_2$ or the like are provided. Each dielectric film 105 has a film thickness of about 20 nm and has an L-shaped cross section. On inner surfaces of the L-shaped dielectric films 105, side-walls 106 having a bottom width of about 50 nm are provided. Each L-shaped dielectric film 105 and its corresponding side-wall 106 constitute a first side-wall spacer (side-wall dielectric film) 112. In regions in the active region 100 outside the first side-wall spacers 112, an n-type impurity such as arsenic or phosphorus is implanted to form n-type deep source/drain regions 107 having a deep junction depth. Each n-type deep source/drain region 107 has a silicide layer 108 in its top-layer portion, and the silicide layer 108 has a layer thickness of about 20 nm.

Around corners at which upper surfaces of the silicide layers 108 on the deep source/drain regions 107 meet side surfaces of the first side-wall spacers 112, second side-wall spacers (side-wall dielectric films) 113 are provided. Each of the second side-wall spacers 113 has a height of about 10 nm and a width of about 10 nm. In this embodiment, it is preferable that a material of the second side-wall spacers 113 is different from that of the side-walls 106. For example, if a silicon nitride film of $Si_3N_4$ or the like is used as a material of the second side-wall spacers 113, it is desirable to use a silicon oxide film of $SiO_2$ or the like as a material of the side-walls 106. If a silicon oxide film of $SiO_2$ or the like is used as a material of the second side-wall spacers 113, it is desirable to use a silicon nitride film of $Si_3N_4$ or the like as a material of the side-walls 106. Note that the second side-wall spacers 113 and the side-walls 106 may be configured by a layered film of, for example, $SiO_2$ and $Si_3N_4$ such that materials of surfaces (at least at side surfaces) of the second side-wall spacers 113 and the side-walls 106 are different from each other. That is, in this embodiment, a material of at least the surfaces of the second side-wall spacers 113 may differ from a material of at least the surfaces of the side-walls 106, and the materials thereof are not limited to those mentioned above.

Over the semiconductor substrate 101, a stressor film 109 formed of a silicon nitride film is provided to cover the second side-wall spacers 113, the gate electrode 103, and the first side-wall spacers 112. The silicon nitride film is a stress dielectric film for exerting a tensile stress on a channel region in the gate length direction. In this embodiment, the stressor film 109 has no slit formed around the corners at which the upper surfaces of the silicide layers 108 on the n-type source/drain regions 107 meet the side surfaces of the first side-wall spacers 112. Moreover, the stressor film 109 has a film thickness of about 30 nm and a tensile stress of 1.7 GPa. Further, over the stressor film 109, an interlayer dielectric film 110 having a film thickness of 350 nm is provided. The interlayer dielectric film 110 is formed by a silicon oxide film, typically a TEOS (tetraethylorthosilicate) film, and has a planarized surface.

As described above, the semiconductor device of Embodiment 1 of the present invention includes the second side-wall spacers 113 around the corners at which the side surfaces of the first side-wall spacers 112 meet the upper surfaces of the silicide layers 108. Therefore, around the corners, side surfaces of the second side-wall spacers 113 on which the stressor film 109 is to be formed have a smooth shape. Thus, the stressor film 109 is not formed over steep regions of side surfaces of the first side-wall spacers 112, so that no slit is formed in the stressor film 109. Therefore, also in a case where the thickness of the stressor film 109 having a great film stress is increased, it is possible to suppress formation of a slit in the stressor film 109, and this makes it possible to prevent saturation of drivability of the NMIS transistor conventionally caused by formation of a slit in the stressor film. That is, by increasing the film thickness of the stressor film 109 having the great film stress, it is possible to improve the drivability of the NMIS transistor.

Moreover, in the semiconductor device of Embodiment 1 of the present invention, a material of the second side-wall spacers 113 is different from that of at least side surfaces of the side-walls 106. Therefore, it is possible to suppress the decrease in film of the side-walls 106 during the formation of the second side-wall spacers 113. This enables to prevent defects, typically an increase in contact leak current, which may occur along with a change in shape of the side-walls 106.

However, the present embodiment is not limited to a case where a material of the second side-wall spacers 113 is different from a material of at least the side surfaces of the side-walls 106. That is, in the present embodiment, the material of the second side-wall spacers 113 may be the same as that of at least the side surfaces of the side-walls 106. Also in this case, providing the second side-wall spacers 113 makes it possible to prevent formation of a slit in the stressor film 109.

A method for fabricating a semiconductor device of Embodiment 1 of the present invention will be described below with reference to the drawings.

FIGS. 2A, 2B, 3A, 3B, 4A, and 4B are cross sectional views showing the main part, with reference to which a method for fabricating the semiconductor device of Embodiment 1 of the present invention is described in the order of steps.

Figure 2A:
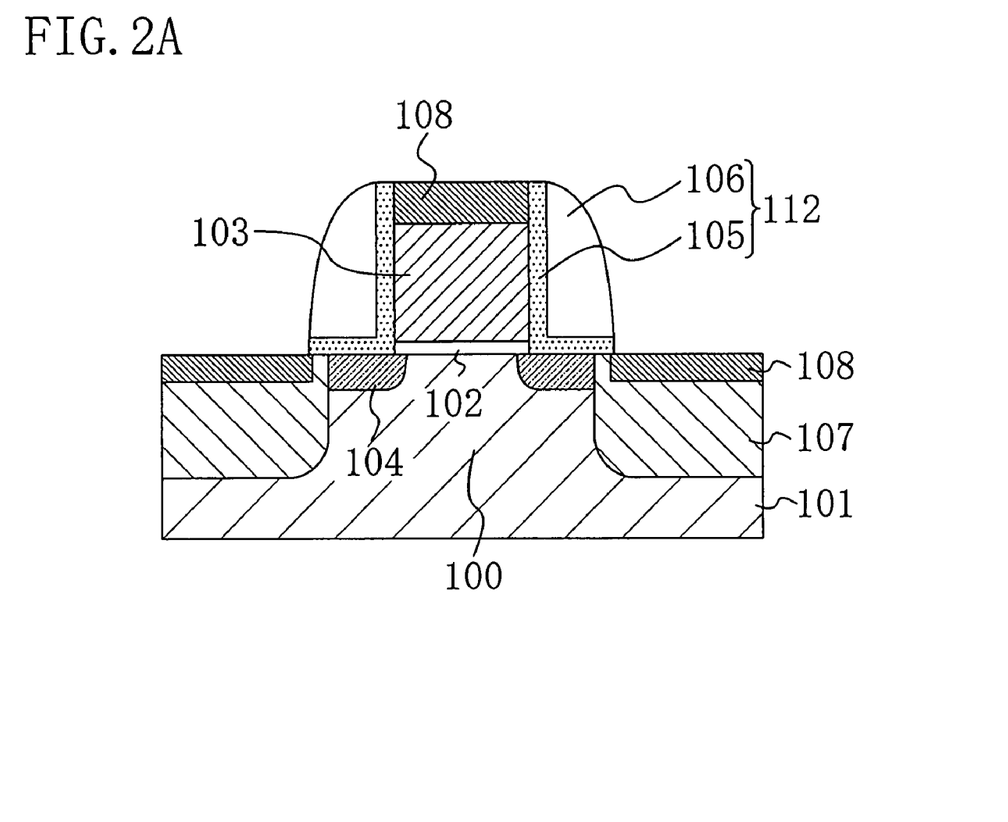
FIGS. 2A and 2B are cross sectional views showing the main part, with reference to which a method for fabricating the semiconductor device of Embodiment 1 of the present invention is described in the order of steps.

First, as illustrated with FIG. 2A, ion implantation is performed to form a p-type well (not shown) for forming an active region 100 in a region of a semiconductor substrate 101 surrounded by a device isolation region (not shown) selectively formed by STI (shallow trench isolation) or the like. The semiconductor substrate 101 is formed of silicon for example. Subsequently, over the active region 100, a gate dielectric film formation film formed of a SiON-based film or the like and having a film thickness of about 2 nm is formed. Then, a gate electrode formation film formed of polysilicon or the like and having a film thickness of about 120 nm is formed. Subsequently, lithography and dry etching technologies are adopted to form a gate dielectric film 102 formed of the gate dielectric film formation film and a gate electrode 103 formed of the gate electrode formation film. The gate electrode 103 has a gate length of about 50 nm.

Subsequently, by using the gate electrode 103 as a mask, ions of n-type impurity such as arsenic or phosphorus are implanted in the active region 100 to form n-type shallow source/drain regions 104 having a shallow junction depth. The implantation is performed under such a condition that the implantation energy is 10 keV and the implantation dose amount is $10^{14}/cm^2$.

Subsequently, a first dielectric film and a second dielectric film are sequentially formed over the entire surface of the semiconductor substrate 101 to cover the gate electrode 103. The first dielectric film is formed for example by a silicon oxide film of $SiO_2$ and has a film thickness of about 20 nm. The second dielectric film is formed of a silicon oxide film of $SiO_2$ or the like and has a film thickness of about 50 nm. Then, the second dielectric film and the first dielectric film are sequentially etched back to form dielectric films 105 and side-walls 106 on side surfaces of the gate dielectric film 102 and the gate electrode 103. The dielectric films 105 are formed of the first dielectric film and have L-shaped cross sections. The side-walls 106 are formed of the second dielectric film and provided to cover inner surfaces of the L-shaped dielectric films 105. In this way, each L-shaped dielectric film 105 and its corresponding side-wall 106 constitute a first side-wall spacer (side-wall dielectric film) 112.

Subsequently, by using the gate electrode 103 and the first side-wall spacers 112 as a mask, ions of n-type impurity such as arsenic or phosphorus are implanted in regions in the active region 100 outside the first side-wall spacers 112 to form n-type deep source/drain regions 107 having a deep junction depth. The implantation is performed under such a condition that the implantation energy is 10 keV and the implantation dose amount is $10^{15}/cm^2$.

Subsequently, over the entire surface of the semiconductor substrate 101, a metal film of cobalt, nickel, or the like is formed to have a thickness of about 10 nm. Then, a thermal treatment is performed to cause a reaction between silicon and metal in the metal film for forming silicide layers 108 formed of NiSi or the like on surfaces of the deep source/drain regions 107 outside the first side-wall spacers 112. At the same time, a silicide layer 108 is formed also in a top-layer portion of the gate electrode 103. Since upper about 10 nm of the gate electrode 103 is silicidized at this time, the thickness of the gate electrode 103 after the formation of the silicide layers 108 is about 110 nm.

Figure 2B:
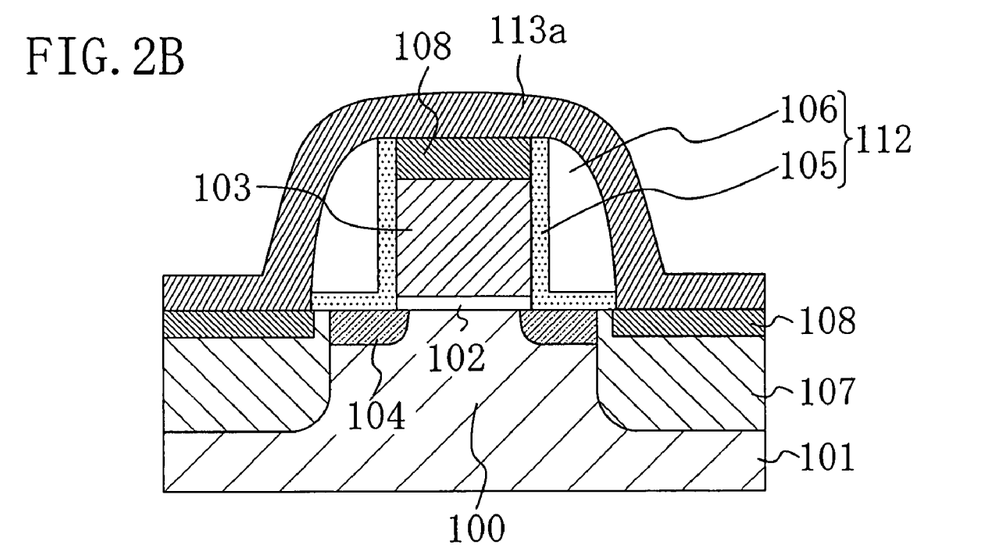

Next, as illustrated with FIG. 2B, over the entire surface of the semiconductor substrate 101, a deposition film 113a for second side-wall spacers is formed to cover the gate electrode 103 and the first side-wall spacers 112. The deposition film 113a is formed of a silicon nitride film of $Si_3N_4$ or the like and has a film thickness of about 10 nm.

Figure 3A:
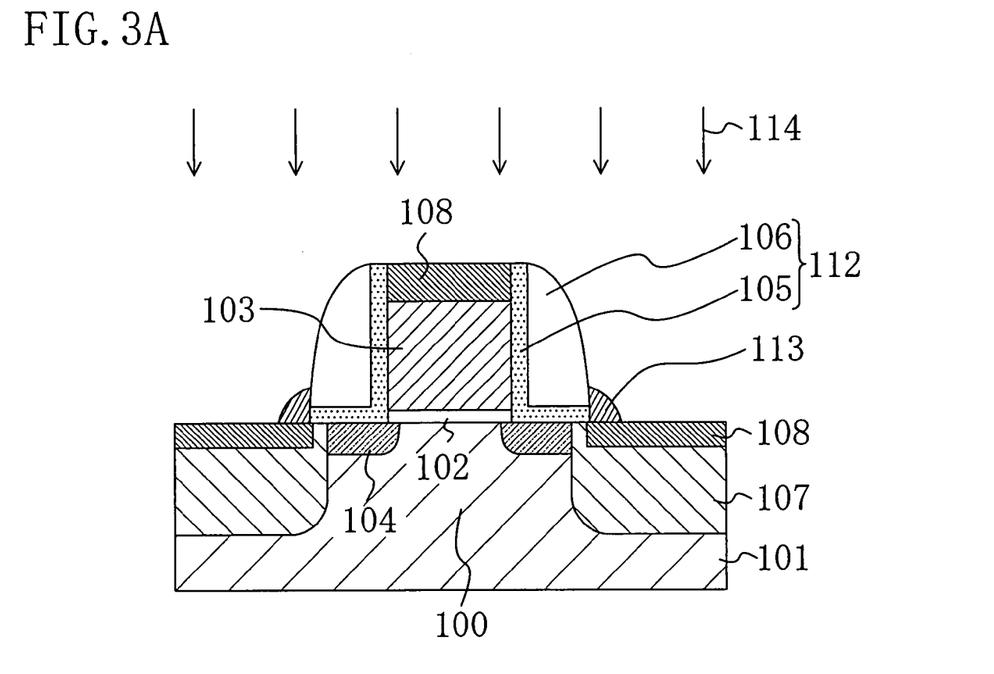
FIGS. 3A and 3B are cross sectional views showing the main part, with reference to which the method for fabricating the semiconductor device of Embodiment 1 of the present invention is described in the order of steps.

Next, as illustrated with FIG. 3A, etching 114 is performed over the entire surface of the semiconductor substrate 101 under such a condition that the etching selection ratio for the silicon nitride film is higher than that for the silicon oxide film. As a result, the second side-wall spacers (side-wall dielectric films) 113 having a height of about 10 nm and having a width of about 10 nm are formed.

In this embodiment, it is preferable that a material of the second side-wall spacers 113 is different from that of the side-walls 106. In the above description, a silicon nitride film of $Si_3N_4$ or the like is used as a material for the second side-wall spacers 113, and a silicon oxide film of $SiO_2$ or the like is used as a material for the side-walls 106. However, a silicon oxide film of $SiO_2$ may be used as a material for the second side-wall spacers 113, and a silicon nitride film of $Si_3N_4$ may be used as a material for the side-walls 106. In this case, etching to form the second side-wall spacers 113 is performed under such a condition that the etching selection ratio for the silicon oxide film is higher than that for the silicon nitride film. Note that the second side-wall spacers 113 and the side-walls 106 may be configured by a layered film of, for example, $SiO_2$ and $Si_3N_4$ such that materials at least of surfaces of the second side-wall spacers 113 and the side-walls 106 are different from each other. That is, in this embodiment, a material of at least the surfaces of the second side-wall spacers 113 may differ from a material of at least the surfaces of the side-walls 106, and the materials thereof are not limited to those mentioned above. If the same material is used as a material of at least the side surfaces of the second side-wall spacers 113 and as a material of the L-shaped dielectric films 105, part of upper portions of the L-shaped dielectric films 105 is removed by etching during the formation of the second side-wall spacers 113.

Figure 3B:
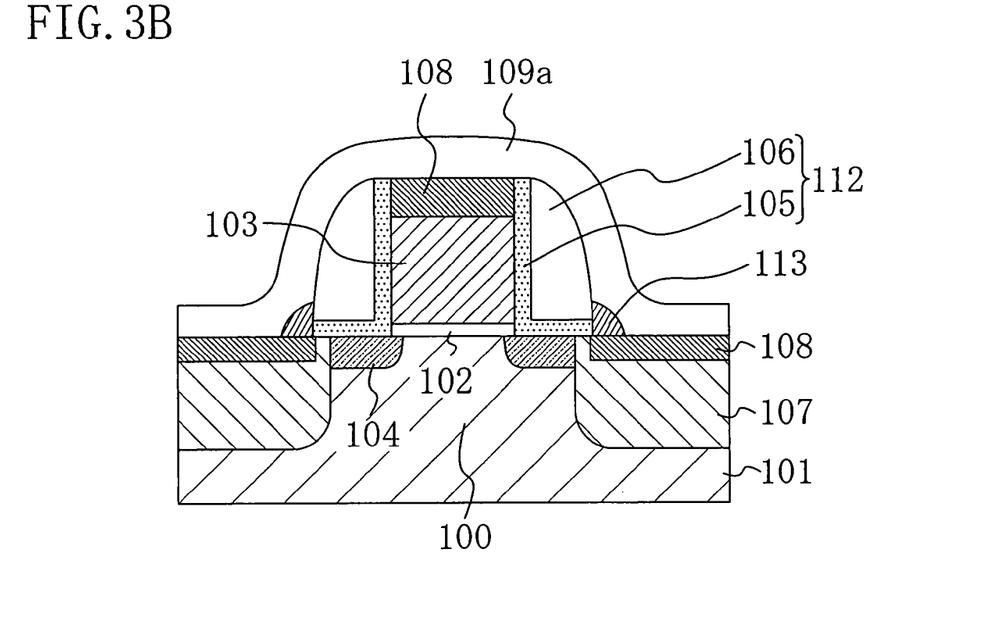

Next, as illustrated with FIG. 3B, plasma CVD (chemical vapor deposition) is performed at a deposition temperature of between and including 250° C. and 450° C. to form a stressor film 109a over the entire surface of the semiconductor substrate 101 to cover the gate electrode 103, the first side-wall spacers 112, and the second side-wall spacers 113. In this embodiment, the stressor formation film 109a is formed of a silicon nitride film containing hydrogen, has a film thickness of about 35 nm, and has a tensile stress (stress generated at a room temperature) of about 0.3 GPa.

Figure 4A:
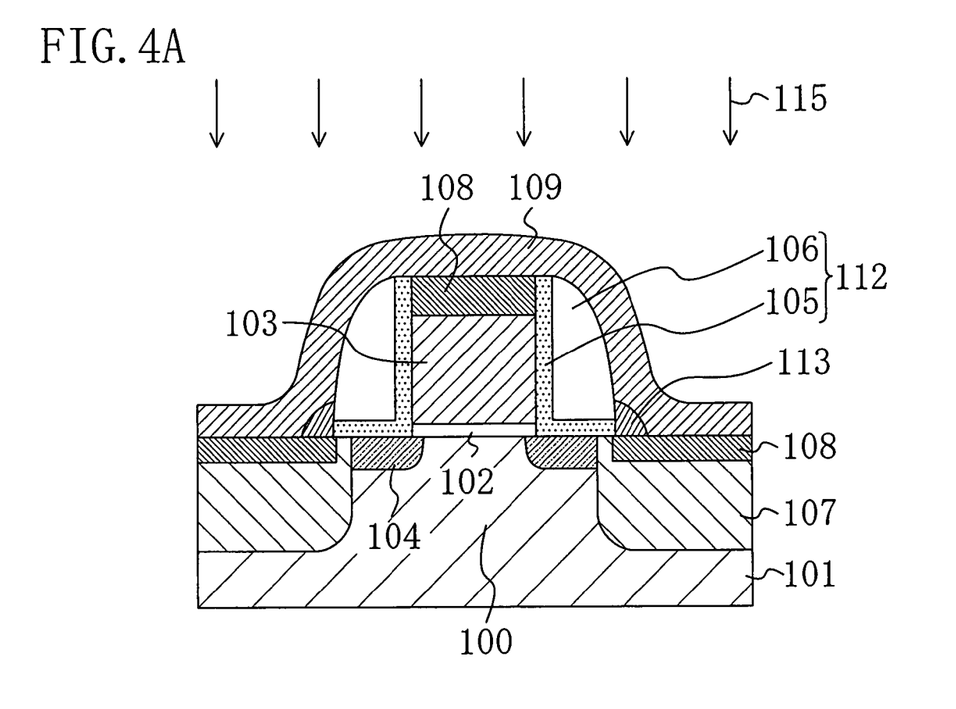
FIGS. 4A and 4B are cross sectional views showing the main part, with reference to which the method for fabricating the semiconductor device of Embodiment 1 of the present invention is described in the order of steps.

Next, as illustrated with FIG. 4A, ultraviolet irradiation 115 is performed toward the entire surface of the semiconductor substrate 101. The ultraviolet irradiation in this embodiment is performed in a nitrogen gas atmosphere for 30 minutes by using ultraviolet light having a wavelength in the range of about 150 nm to 400 nm, with a semiconductor wafer being put on a stage having a temperature of 450° C. In this way, hydrogen atoms contained in the stressor film 109a are eliminated, which causes film contraction. As a result, a stressor film 109 of a silicon nitride film having a film thickness of 30 nm and having a tensile stress of about 1.7 GPa is formed. Instead of ultraviolet irradiation, thermal annealing may be performed at a temperature in the range of 450° C. to 600° C. to cause the film contraction of the stressor film 109a.

Figure 4B:
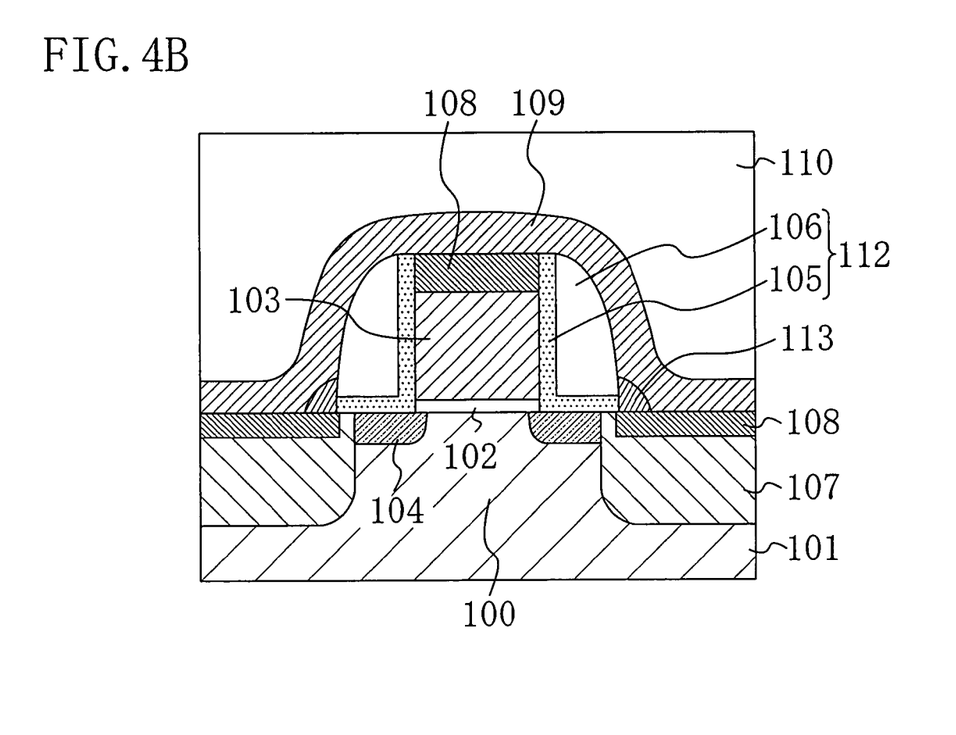

Next, as illustrated with FIG. 4B, over the entire surface of the stressor film 109, a silicon oxide film, typically a TEOS film, is formed to have a thickness of about 500 nm. Then, CMP (chemical mechanical polishing) is performed for surface planarization to form an interlayer dielectric film 110 having a film thickness of about 350 nm.

As described above, according to the method for fabricating a semiconductor device of Embodiment 1 of the present invention, the second side-wall spacers 113 are formed around corners at which side surfaces of the first side-wall spacers 112 meet upper surfaces of the silicide layers 108. Therefore, around the corners, side surfaces of the second side-wall spacers 113 which are underlying layers of the stressor film 109 have a smooth shape and the stressor film 109 is formed thereon. As described above, since the stressor film 109 is not formed over steep regions of side surfaces of the first side-wall spacers 112, no slit is formed in the stressor film 109. Therefore, also in a case where the thickness of the stressor film 109 having great stress is increased, it is possible to suppress formation of a slit in the stressor film 109, and this makes it possible to prevent saturation of drivability of the NMIS transistor conventionally caused by formation of a slit in the stressor film 109. That is, by increasing the film thickness of the stressor film 109 having a great film stress, it is possible to improve the drivability of the NMIS transistor. Moreover, since the second side-wall spacers 113 are formed after the formation of the silicide layers 108, the shape of the silicide layers 108 is not changed, so that deterioration in properties attributed to silicide, typically an increase in junction leak current, does not occur.

Moreover, according to the method for fabricating the semiconductor device of Embodiment 1 of the present invention, a material of the second side-wall spacers 113 is different from that of at least side surfaces of the side-walls 106. Therefore, it is possible to suppress the decrease in film of the side-walls 106 during the formation of the second side-wall spacers 113. This enables to prevent defects, typically an increase in a contact leak current, which may occur along with a change in shape of the side-walls 106.

Note that the present embodiment is not limited to a case where a material of the second side-wall spacers 113 is different from a material of at least the side surfaces of the side-walls 106. That is, in the present embodiment, the material of the second side-wall spacers 113 may be the same as that of the side surfaces of the side-walls 106. Also in this case, providing the second side-wall spacers 113 makes it possible to prevent formation of a slit in the stressor film 109.

Embodiment 2

A configuration of a semiconductor device of Embodiment 2 of the present invention will be described below with reference to the drawings.

Figure 5:
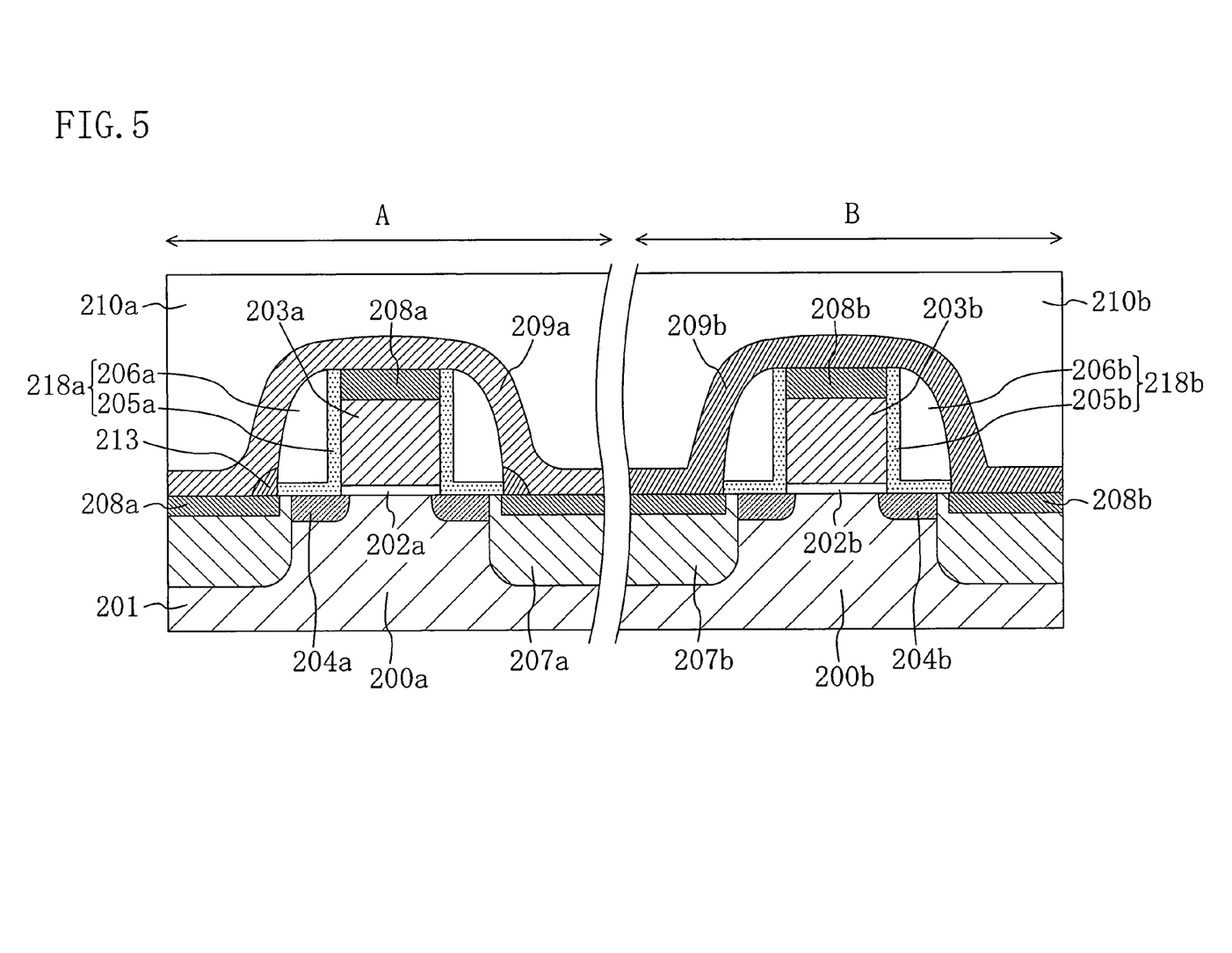
FIG. 5 is a cross sectional view showing a configuration of a main part of a semiconductor device of Embodiment 2 of the present invention.

FIG. 5 is a cross sectional view showing a configuration of a main part of a semiconductor device of Embodiment 2 of the present invention.

In an NMIS region A of FIG. 5 where an NMIS transistor is to be formed, a semiconductor substrate 201 formed of silicon or the like has a first active region 200a surrounded by a device isolation region which is not shown. The first active region 200a is provided with a p-well (not shown). Over the first active region 200a, a first gate electrode 203a having a first silicide layer 208a in its top-layer portion is formed through a first gate dielectric film 202a. The first gate dielectric film 202a is formed of a SiON-based film or the like and has a film thickness of about 2 nm. The first gate electrode 203a has a thickness of about 110 nm. The first silicide layer 208a is formed of NiSi or the like and has a layer thickness of about 20 nm. The gate electrode 203a has a gate length of about 50 nm.

In regions in the first active region 200a at both sides of the first gate electrode 203a, an n-type impurity such as arsenic or phosphorus is implanted to form n-type first shallow source/drain regions (n-type extension regions or n-type LDD regions) 204a having a shallow junction depth. On side surfaces of the first silicide layer 208a, the first gate electrode 203a, and the first gate dielectric film 202a and over the first active region 200a, first L-shaped dielectric films 205a of $SiO_2$ or the like are provided. Each first L-shaped dielectric film 205a has a film thickness of about 20 nm and has an L-shaped cross section. On inner surfaces of the first L-shaped dielectric films 205a, first side-walls 206a having a bottom width of about 50 nm are provided. Each first L-shaped dielectric film 205a and its corresponding first side-wall 206a constitute a first side-wall spacer (side-wall dielectric film) 218a. In regions in the first active region 200a outside the first side-wall spacers 218a, an n-type impurity such as arsenic or phosphorus is implanted to form n-type first deep source/drain regions 207a having a deep junction depth. Each n-type first deep source/drain region 207a has a first silicide layer 208a in its top-layer portion, and the first silicide layer 208a has a layer thickness of about 20 nm.

Around corners at which surfaces of the first silicide layers 208a on the first deep source/drain regions 207a meet side surfaces of the first side-wall spacers 218a, third side-wall spacers (side-wall dielectric films) 213 are provided. Each of the third side-wall spacers 213 has a height of about 10 nm and a width of about 10 nm. In this embodiment, a material of the third side-wall spacers 213 is preferably different from that of the first side-walls 206a. For example, if a silicon nitride film of $Si_3N_4$ or the like is used as a material of the third side-wall spacers 213, it is desirable to use a silicon oxide film of $SiO_2$ or the like as a material of the first side-walls 206a. If a silicon oxide film of $SiO_2$ or the like is used as a material of the third side-wall spacers 213, it is desirable to use a silicon nitride film of $Si_3N_4$ or the like as a material of the first side-walls 206a. Note that the third side-wall spacers 213 and the first side-walls 206a may be configured by a layered film of, for example, $SiO_2$ and $Si_3N_4$ such that materials of side surfaces of the third side-wall spacers 213 and the first side-walls 206a are different from each other. That is, in this embodiment, a material of at least the surfaces of the third side-wall spacers 213 may differ from a material of at least the surfaces of the first side-walls 206a, and the materials of thereof are not limited to those mentioned above.

Over the semiconductor substrate 201, a first stressor film 209a formed of a silicon nitride film is provided to cover the first gate electrode 203a, the first side-wall spacers 218a, and the third side-wall spacers 213. The silicon nitride film is a stress dielectric film for exerting a tensile stress on a channel region in the gate length direction. In this embodiment, the first stressor film 209a has a film thickness of about 30 nm and a tensile stress of 1.7 GPa. Further, over the first stressor film 209a, a first interlayer dielectric film 210a is provided.

Meanwhile, in a PMIS region B of FIG. 5 where a PMIS transistor is to be formed, a semiconductor substrate 201 has a second active region 200b surrounded by a device isolation region which is not shown. The second active region 200b is provided with an n-well (not shown). Over the second active region 200b, a second gate electrode 203b having a second silicide layer 208b in its top-layer portion is formed through a second gate dielectric film 202b. The second gate dielectric film 202b is formed of a SiON-based film or the like and has a film thickness of about 2 nm. The second gate electrode 203a has a thickness of about 110 nm. The second silicide layer 208a is formed of NiSi or the like and has a layer thickness of about 20 nm. In regions in the second active region 200b at both sides of the second gate electrode 203b, a p-type impurity such as boron or indium is implanted to form p-type second shallow source/drain regions (p-type extension regions or p-type LDD regions) 204b having a shallow junction depth. On side surfaces of the second silicide layer 208b, the second gate electrode 203b, and the second gate dielectric film 202b and over the second active region 200b, second L-shaped dielectric films 205b formed of $SiO_2$ or the like are provided. Each second L-shaped dielectric film 205b has a film thickness of about 20 nm and has an L-shaped cross section. On inner surfaces of the second L-shaped dielectric films 205b, second side-walls 206b having a bottom width of about 50 nm are provided. Each second L-shaped dielectric film 205b and its corresponding second side-wall 206b constitute a second side-wall spacer (side-wall dielectric film) 218b. The second side-walls 206b may be formed of a layered film. In regions in the second active region 200b outside the second side-wall spacers 218b, a p-type impurity is implanted to form p-type second deep source/drain regions 207b having a deep junction depth. Each p-type second deep source/drain region 207b has a second silicide layer 208b in its top-layer portion, and the second silicide layer 208b has a layer thickness of about 20 nm.

Over the semiconductor substrate 201, a second stressor film 209b formed of a silicon nitride film is provided to cover the second gate electrode 203b and the second side-wall spacers 218b. The silicon nitride film is formed as a unit with the first stressor film 209a and is a stress dielectric film for exerting a compressive stress on a channel region in the gate length direction. In this embodiment, the second stressor film 209b has a film thickness of 30 nm and a compressive stress of 2.0 GPa. Further, on the second stressor film 209b, a second interlayer dielectric film 210b formed as a unit with the first interlayer dielectric film 210a is provided. Note that no side-wall spacer corresponding to the third side-wall spacers 213 in the NMIS region A is formed in the PMIS region B.

As described above, in the NMIS region A, the semiconductor device of Embodiment 2 of the present invention includes the third side-wall spacers 213 provided around the corners at which the side surfaces of the first side-wall spacers 218a meet the upper surfaces of the first silicide layers 208a. Therefore, around the corners, side surfaces of the third side-wall spacers 213 on which the first stressor film 209a is to be formed have a smooth shape. Thus, the first stressor film 209a is not formed over steep regions of side surfaces of the first side-wall spacers 218a, so that no slit is formed in the first stressor film 209a. Therefore, also in a case where the thickness of the first stressor film 209a and the second stressor film 209b having a great film stress is increased, it is possible to suppress formation of a slit in the first stressor film 209a, and this makes it possible to prevent saturation of drivability of the NMIS transistor conventionally caused by formation of a slit in the stressor film. That is, by increasing the film thickness of the first stressor film 209a having a great film stress, it is possible to improve the drivability of the NMIS transistor.

Meanwhile, since the second stressor film 209b has the compressive stress in the PMIS region B, there is no concern about slit formation even if the thickness of the second stressor film 209b is increased. Moreover, since no side-wall spacers corresponding to the third side-wall spacers 213 of the NMIS region A are provided in the PMIS region B, it is possible to narrow the distance between gate electrodes in an integrated circuit, which can contribute to improvement in integration degree.

As described above, since the semiconductor device of Embodiment 2 of the present invention includes transistors having configurations respectively suitable to the NMIS region A and the PMIS region B, it is possible to improve the drivability of the NMIS transistor and to improve the integration degree of the whole CMOS circuit.

A method for fabricating a semiconductor device of Embodiment 2 of the present invention will be described below with reference to the drawings.

FIGS. 6A and 6B through FIGS. 9A and 9B are cross sectional views showing the main part, with reference to which a method for fabricating the semiconductor device of Embodiment 2 of the present invention is described in the order of steps.

Figure 6A:
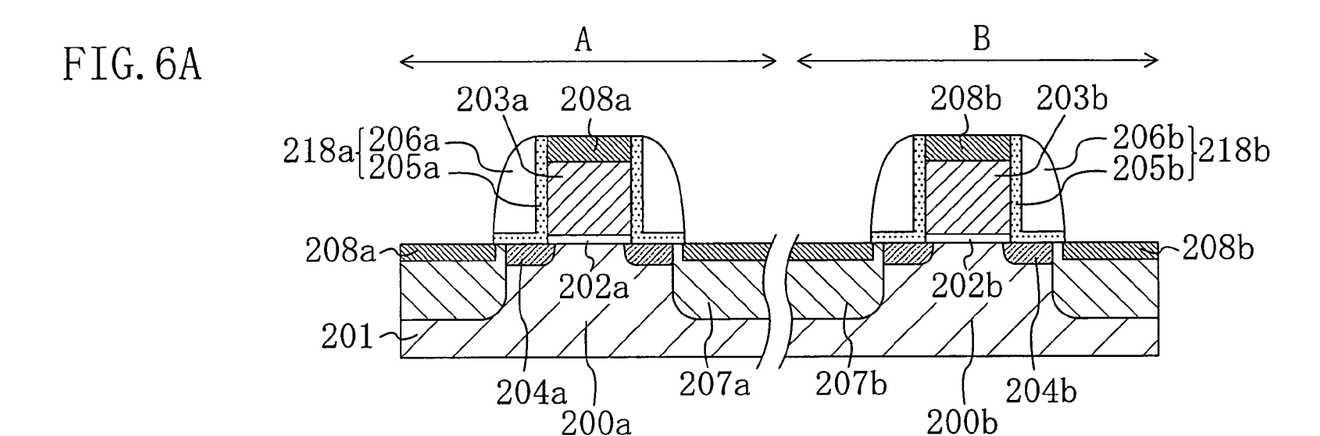
FIGS. 6A and 6B are cross sectional views showing the main part, with reference to which a method for fabricating the semiconductor device of Embodiment 2 of the present invention is described in the order of steps.

First, as illustrated with FIG. 6A, in regions in a semiconductor substrate 201 surrounded by a device isolation region (not shown), ions of a p-type impurity are implanted by using a predetermined mask for selectively forming a p-well (not shown) to form a first active region 200a in an NMIS region A, and ions of an n-type impurity are implanted by using a predetermined mask for selectively forming an n-well (not shown) to form a second active region 200b in a PMIS region B. Subsequently, over the first active region 200a, a first gate dielectric film 202a and a first gate electrode 203a are formed, and over the second active region 200b, a second gate dielectric film 202b and a second gate electrode 203b are formed. The first gate dielectric film 202a is formed of a SiON-based film or the like and has a film thickness of about 2 nm. The first gate electrode 203a is formed of polysilicon or the like and has a thickness of about 120 nm. The second gate dielectric film 202b is formed of a SiON-based film or the like and has a film thickness of about 2 nm. The second gate electrode 203b is formed of polysilicon or the like and has a thickness of about 120 nm.

Subsequently, by using the first gate electrode 203a as a mask, ions of an n-type impurity are implanted to form n-type first shallow source/drain regions 204a having a shallow junction depth in regions in the first active region 200a at both sides of the first gate electrode 203a. By using the second gate electrode 203b as a mask, ions of a p-type impurity are implanted to form p-type second shallow source/drain regions 204b having a shallow junction depth in regions in the second active region 200b at both sides of the second gate electrode 203b.

Subsequently, on side surfaces of the first gate dielectric film 202a and the first gate electrode 203a, first L-shaped dielectric films 205a of SiO$_2$ or the like are formed, and on side surfaces of the second gate dielectric film 202b and the second gate electrode 203b, second L-shaped dielectric films 205b of SiO$_2$ or the like are formed. Each first L-shaped dielectric film 205a has a film thickness of about 20 nm and has an L-shaped cross section. Each second L-shaped dielectric film 205b has a film thickness of about 20 nm and has an L-shaped cross section. Simultaneously with the formation of the first L-shaped dielectric films 205a and the second L-shaped dielectric films 205b, first side-walls 206a having a bottom width of about 50 nm are formed on inner surfaces of the first L-shaped dielectric films 205a, and second side-walls 206b having a bottom width of about 50 nm are formed on inner surfaces of the second L-shaped dielectric films 205b. In this way, each first L-shaped dielectric film 205a and its corresponding first side-wall 206a constitute a first side-wall spacer 218a, and each second L-shaped dielectric film 205b and its corresponding second side-wall 206b constitute a second side-wall spacer (side-wall dielectric film) 218b. Note that the first and second side-walls 206a and 206b may be formed of layered films.

Subsequently, by using the first gate electrode 203a and the first side-wall spacers 218a as a mask, ions of an n-type impurity are implanted to form n-type first deep source/drain regions 207a having a deep junction depth in regions in the first active region 200a outside the first side-wall spacers 218a. Moreover, by using the second gate electrode 203b and the second side-wall spacers 218b as a mask, ions of a p-type impurity are implanted to form p-type second deep source/drain regions 207b having a deep junction depth in regions in the second active region 200b outside the second side-wall spacers 218b.

Subsequently, over the entire surface of the semiconductor substrate 201, a metal film of cobalt, nickel, or the like is formed. Then, a thermal treatment is performed to form first silicide layers 208a having a layer thickness of about 20 nm and to form second silicide layers 208b having a layer thickness of about 20 nm. The first silicide layers 208a are formed in the top-layer portions of the first deep source/drain regions 207a outside the first side-wall spacers 218a and in the top-layer portion of the first gate electrode 203a. The second silicide layers 208b are formed in the top layer portions of the second deep source/drain regions 207b outside the second side-wall spacers 218b and in the top-layer portion of the second gate electrode 203b.

Figure 6B:
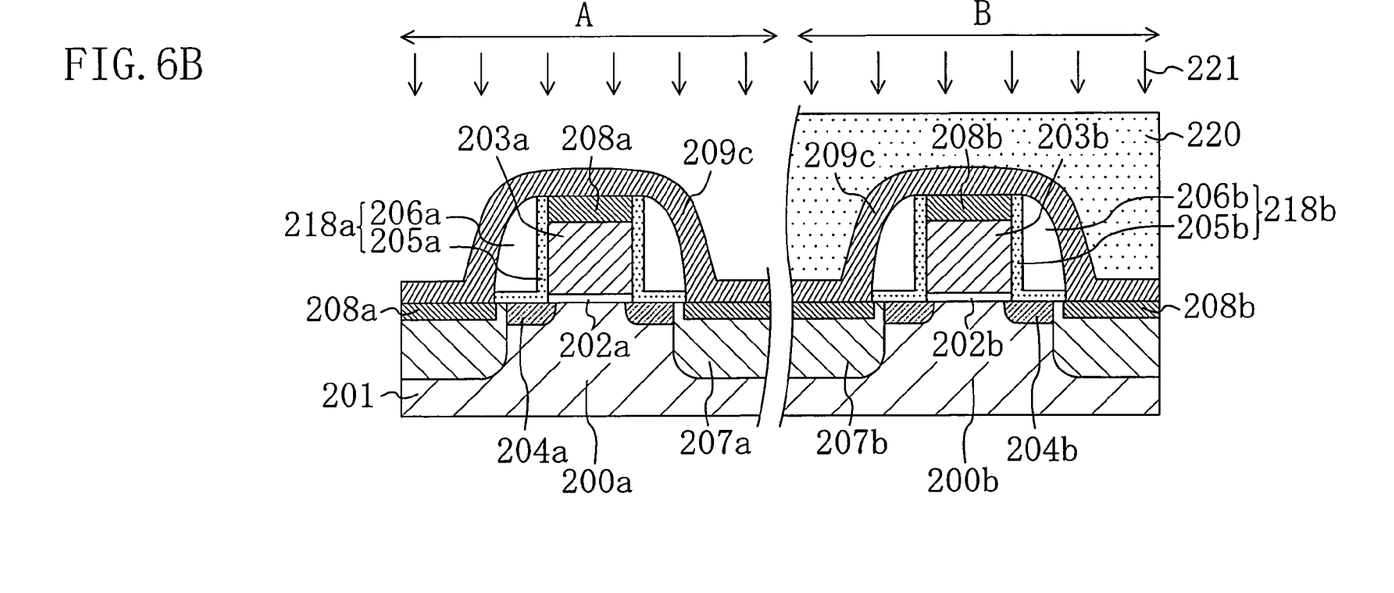

Next, as illustrated with FIG. 6B, over the entire surface of the semiconductor substrate 201, a stressor formation film 209c is formed. The stressor formation film 209c is formed of a silicon nitride film having a film thickness of about 20 nm and has a compressive stress of about 2 GPa. Subsequently, by using a resist mask 220 masking only the PMIS region B, etching 221 is performed on the stressor formation film 209c in the NMIS region A.

Figure 7A:
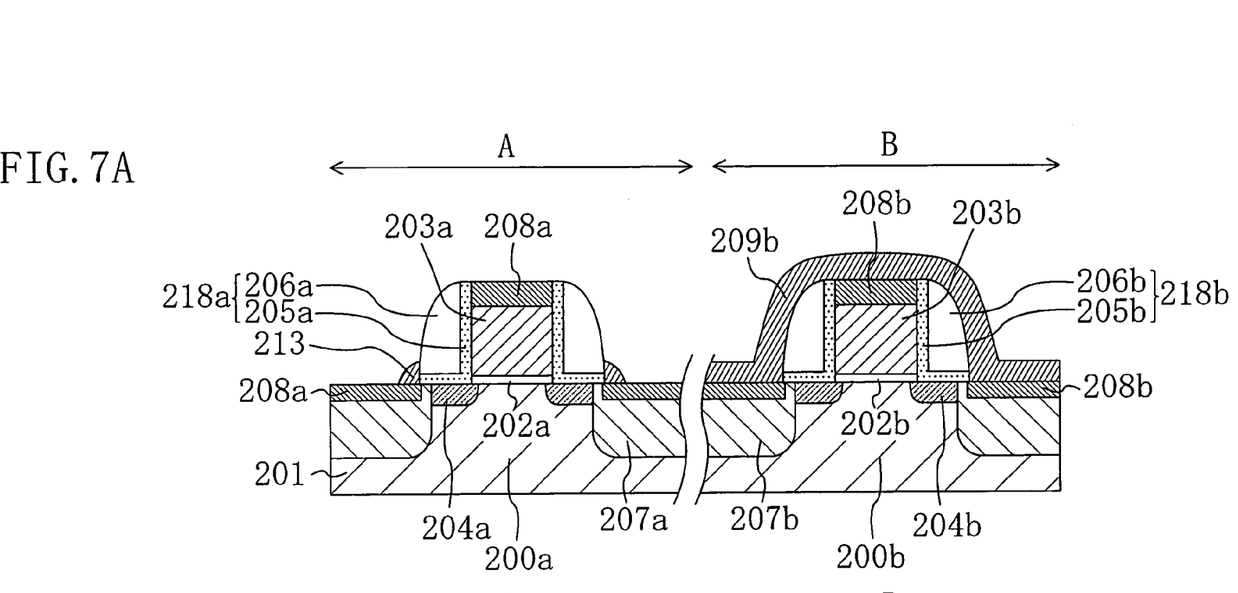
FIGS. 7A and 7B are cross sectional views showing the main part, with reference to which the method for fabricating the semiconductor device of Embodiment 2 of the present invention is described in the order of steps.

In this way, as illustrated with FIG. 7A, in the NMIS region A, third side-wall spacers (side-wall dielectric films) 213 are formed around corners at which upper surfaces of the first silicide layers 208a on the first deep source/drain regions 207a meet side surfaces of the first side-wall spacers 218a.

Each third side-wall spacer 213 has a height of about 10 nm and a width of about 10 nm. At this time, a second stressor film 209b is formed in the PMIS region B. The second stressor film 209b is the stressor formation film 209c which is not removed but remains. Then, the resist mask 220 is removed.

Figure 7B:
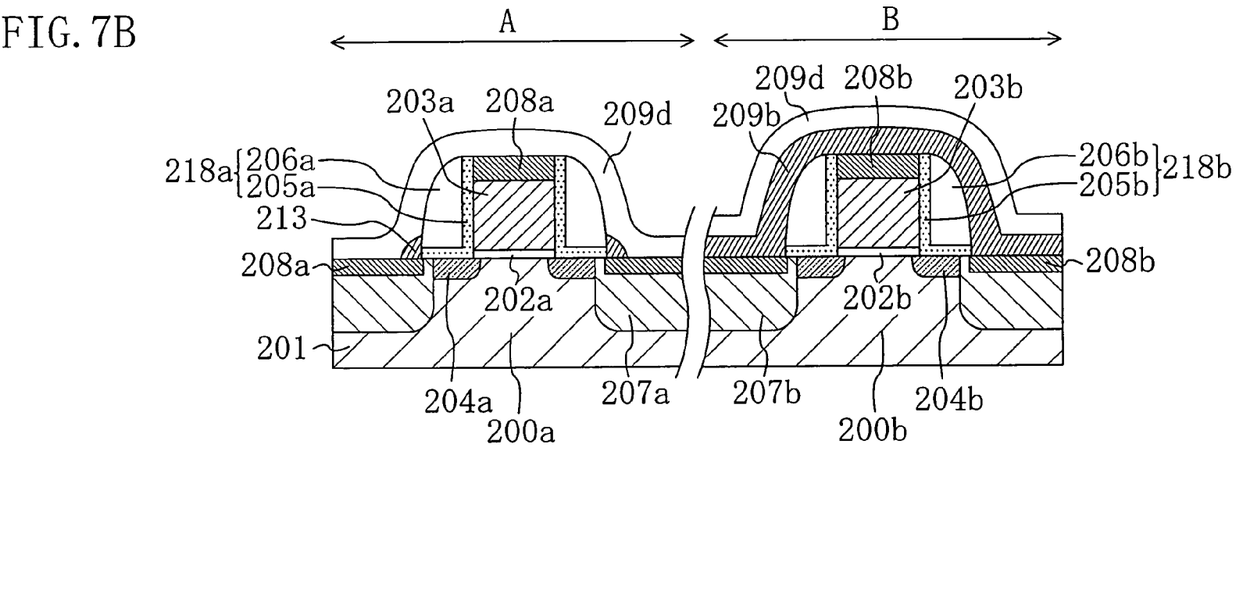

Next, as illustrated with FIG. 7B, over the entire surface of the semiconductor substrate 201, a stressor formation film 209d is formed. The stressor formation film 209d is formed of a silicon nitride film and has a tensile stress of about 0.3 GPa. The silicon nitride film has a film thickness of about 35 nm and contains hydrogen.

Figure 8A:
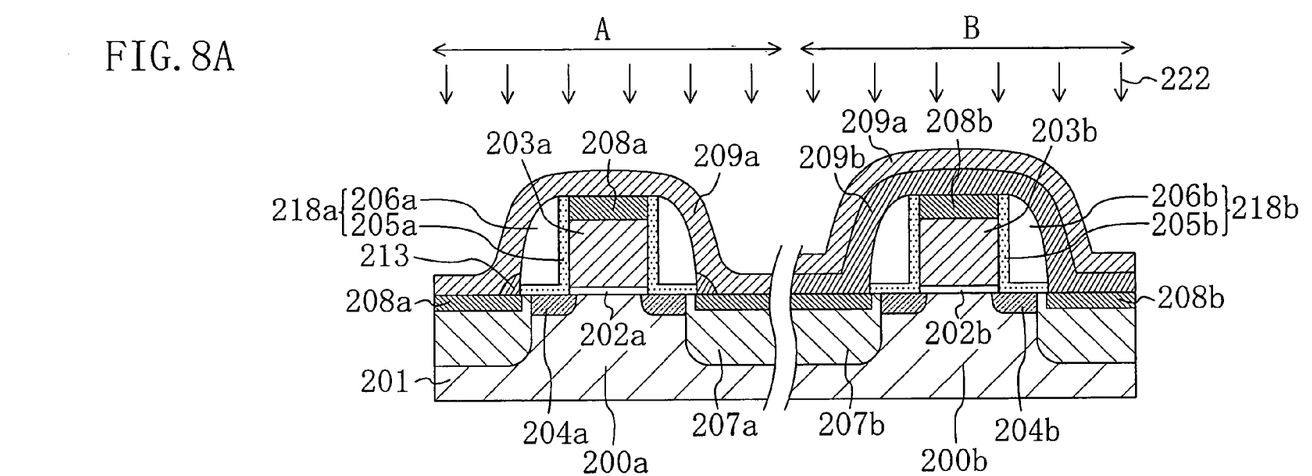
FIGS. 8A and 8B are cross sectional views showing the main part, with reference to which the method for fabricating the semiconductor device of Embodiment 2 of the present invention is described in the order of steps.

Next, as illustrated with FIG. 8A, ultraviolet irradiation 222 is performed toward the entire surface of the semiconductor substrate 201. The ultraviolet irradiation 222 in this embodiment is performed in a nitrogen gas atmosphere for 30 minutes by using ultraviolet light having a wavelength in the range of about 150 nm to 400 nm, with a semiconductor wafer being put on a stage having a temperature of 450° C. In this way, hydrogen atoms contained in the stressor formation film 209d are eliminated, which causes film contraction. As a result, in the NMIS region A and the PMIS region B, a first stressor film 209a is formed. The first stressor film 209a is formed of a silicon nitride film having a film thickness of 30 nm and has a tensile stress of about 1.7 GPa. Instead of ultraviolet irradiation, thermal annealing may be performed at a temperature in the range of 450° C. to 600° C.

Figure 8B:
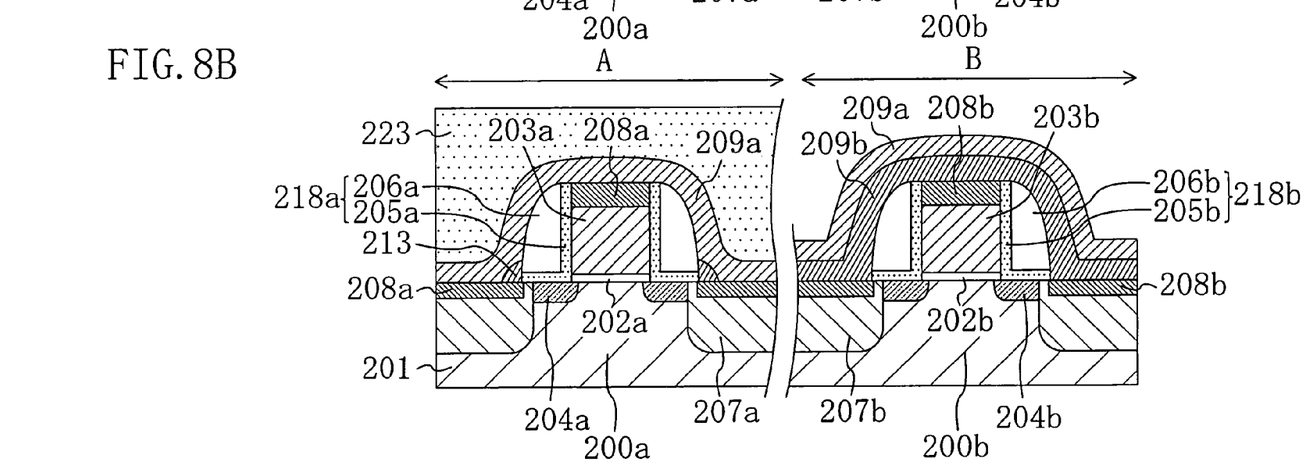
Figure 9A:
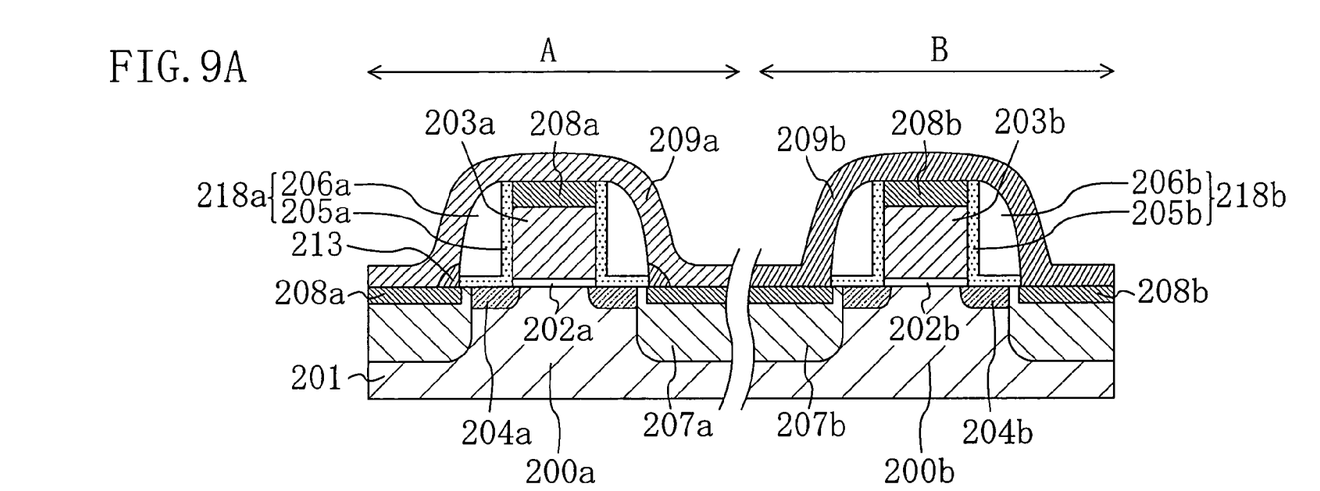
FIGS. 9A and 9B are cross sectional views showing the main part, with reference to which the method for fabricating the semiconductor device of Embodiment 2 of the present invention is described in the order of steps.

Next, as illustrated with FIG. 8B, by using a resist mask 223 masking only the NMIS region A, the first stressor film 209a in the PMIS region B is etched. As a result, the first stressor film 209a in the PMIS region B is removed as shown in FIG. 9A. In this way, the first stressor film 209a is formed in the NMIS region A, and the second stressor film 209b is formed in the PMIS region B. Instead of steps illustrated with FIGS. 7B, 8A, and 8B, the second stressor formation film 209d is first formed, and then the stressor formation film 209d in the PMIS region B is removed by etching using a resist mask masking the NMIS region A. Then, the resist mask masking the NMIS region A is removed. After that, ultraviolet irradiation (or thermal annealing) is performed by using a resist mask masking the PMIS region B to form the first stressor film 209a in the NMIS region A. Then, the resist mask masking the PMIS region B is removed. Also in this way, the configuration of FIG. 9A is realized.

Figure 9B:
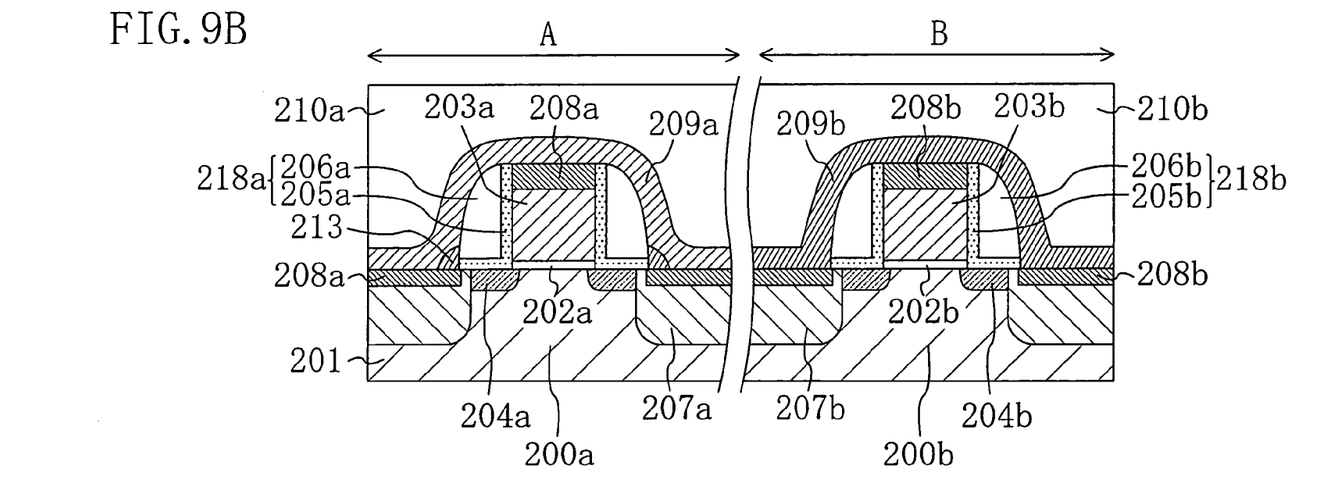

Next, as illustrated with FIG. 9B, over the entire surface of the first stressor film 209a and the second stressor film 209b, a silicon oxide film, typically a TEOS film, is formed to have a film thickness of about 500 nm. Then, CMP is performed for surface planarization to form a first interlayer dielectric film 210a and a second inter layer dielectric film 210b having a film thickness of about 350 nm, respectively.

As described above, according to the method for fabricating a semiconductor device of Embodiment 2 of the present invention, in the NMIS region A, the third side-wall spacers 213 is formed around the corners at which the side surfaces of the first side-wall spacers 218a meet the upper surfaces of the first silicide layers 208a. Therefore, around the corners, side surfaces the third side-wall spacers 213 on which the first stressor film 209a is to be formed have a smooth shape. Thus, the first stressor film 209a is not formed over steep regions of side surfaces of the first side-wall spacers 218a, so that no slit is formed in the first stressor film 209a. Therefore, also in a case where the thickness of the first stressor film 209a and the second stressor film 209b having a great film stress is increased, it is possible to suppress formation of a slit in the first stressor film 209a, and this makes it possible to prevent saturation of drivability of the NMIS transistor conventionally caused by formation of a slit in the stressor film. That is, by increasing the film thickness of the first stressor film 209a having a great film stress, it is possible to improve the drivability of the NMIS transistor. Moreover, since the third side-wall spacers 213 are formed after the formation of the first silicide layers 208a, the shape of the first silicide layers 208a is not changed, so that deterioration in properties attributed to silicide, typically an increase in junction leak current, does not occur.

Meanwhile, since the second stressor film 209b has a compressive stress in the PMIS region B, there is no concern about slit formation even if the thickness of the second stressor film 209b is increased. Moreover, since no side-wall spacers corresponding to the third side-wall spacers 213 of the NMIS region A are provided in the PMIS region B, it is possible to narrow the distance between gate electrodes in an integrated circuit, which can contribute to improvement in integration degree.

As described above, according to the method for fabricating a semiconductor device of Embodiment 2 of the present invention, forming transistors having configurations respectively suitable to the NMIS region A and the PMIS region B makes it possible to improve the drivability of the NMIS transistor and to improve the integration degree of the whole CMOS circuit.

Also in the semiconductor device and the method for fabricating the same of Embodiment 2 of the present invention described above as in Embodiment 1, a material of side surfaces of the third side-wall spacers 213 may be different from or may be the same as that of side surfaces of the first side-walls 206a. Also in Embodiment 2 as in Embodiment 1, using different materials for the side surfaces of the third side-wall spacers 213 and the first side-walls 206a makes it possible to prevent defects, typically an increase in contact leak current, which may occur along with a change in shape of the first side-walls 206a. If a material of at least the side surfaces of the third side-wall spacers 213 is the same as that of the first L-shaped dielectric films 205a, part of upper portions of the L-shaped dielectric films 205a is removed by etching as in Embodiment 1.

In the semiconductor device and the method for fabricating the same of Embodiment 2 of the present invention described above, the film thickness, the stress value and materials of the third side-wall spacers 213, the first stressor film 209a, and the second stressor film 209b are mere examples and not limited to those described in the above embodiments.

The present invention is applicable to a semiconductor device including an NMIS transistor in which the film thickness of a stressor film is increased in an attempt to increase a tensile stress exerted on a channel region in the gate length direction.

What is claimed is:

1. A semiconductor device comprising an NMIS transistor over a first active region of a semiconductor substrate, the NMIS transistor including:
a first gate dielectric film over the first active region;
a first gate electrode on the first gate dielectric film;
a first side-wall dielectric film on side surfaces of the first gate dielectric film and the first gate electrode;
a first source/drain region in the first active region outside the first side-wall dielectric film;
a first silicide layer in a top-layer portion of the first source/drain region;
a second side-wall dielectric film formed on the first silicide layer to cover around a corner at which the side surface of the first side-wall dielectric film meets an upper surface of the first silicide layer; and a first stressor film for exerting a tensile stress on a channel region in a gate length direction, the first stressor film covering the first gate electrode, the first side-wall dielectric film, and the second side-wall dielectric film,
wherein the first stressor film is not in contact with a surface of the corner at which the side surface of the first side-wall dielectric film meets the upper surface of the first silicide layer.

2. The semiconductor device of claim 1, wherein the second side-wall dielectric film is lower in height than the first side-wall dielectric film.

3. The semiconductor device of claim 1, wherein a material of at least the side surface of the first side-wall dielectric film is different from a material of the second side-wall dielectric film.

4. The semiconductor device of claim 1, wherein the first side-wall dielectric film is composed of:
a first dielectric film being in contact with the side surface of the first gate electrode and having an L-shaped cross section; and
a first side-wall on an inner surface of the first dielectric film.

5. The semiconductor device of claim 1, wherein the first stressor film is formed of a silicon nitride film or a silicon nitride film containing hydrogen.

6. The semiconductor device of claim 1, wherein the first stressor film has no slit formed around the corner at which the side surface of the first side-wall dielectric film meets the upper surface of the first silicide layer.

7. The semiconductor device of claim 1, further comprising a PMIS transistor over a second active region in the semiconductor substrate, the second active region being different from the first active region, the PMIS transistor including:
a second gate dielectric film over the second active region;
a second gate electrode on the second gate dielectric film;
a third side-wall dielectric film on side surfaces of the second gate dielectric film and the second gate electrode;
a second source/drain region in the second active region outside the third side-wall dielectric film;
a second silicide layer in a top-layer portion of the second source/drain region;
a second stressor film for exerting a compressive stress on a channel region in a gate length direction, the second stressor film covering the second gate electrode and the third side-wall dielectric film.

8. The semiconductor device of claim 7, wherein the second side-wall dielectric film and the second stressor film are formed of the same dielectric film.

9. The semiconductor device of claim 7, wherein no side-wall dielectric film is provided around a corner at which a side surface of the third side-wall dielectric film meets an upper surface of the second silicide layer.

10. The semiconductor device of claim 1, wherein the second side-wall dielectric film is in contact with the first silicide layer.

11. The semiconductor device of claim 1, wherein a bottom surface of the second side-wall dielectric film is in contact with the upper surface of the first silicide layer.

12. The semiconductor device of claim 4, wherein the second side-wall dielectric film covers a side-wall of the first dielectric film located between an upper surface of the first active region and a bottom surface of the first side wall.

13. The semiconductor device of claim 4, wherein the first stressor film is not in contact with the side wall of the first dielectric film located between an upper surface of the first active region and a bottom surface of the first side wall.

* * * * *